(12) United States Patent
Park et al.

(10) Patent No.: US 10,784,260 B2
(45) Date of Patent: Sep. 22, 2020

(54) SEMICONDUCTOR DEVICE

(71) Applicant: SAMSUNG ELECTRONICS CO., LTD., Suwon-si, Gyeonggi-do (KR)

(72) Inventors: Jongho Park, Suwon-si (KR); Wandon Kim, Seongnam-si (KR); Jeonghyuk Yim, Seoul (KR); Sangjin Hyun, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 43 days.

(21) Appl. No.: 16/116,295

(22) Filed: Aug. 29, 2018

(65) Prior Publication Data
US 2019/0198498 A1    Jun. 27, 2019

(30) Foreign Application Priority Data

Dec. 22, 2017  (KR) .................... 10-2017-0177895

(51) Int. Cl.
| H01L 27/092 | (2006.01) |
| H01L 29/49 | (2006.01) |
| H01L 27/088 | (2006.01) |
| H01L 21/8238 | (2006.01) |
| H01L 21/8234 | (2006.01) |

(52) U.S. Cl.
CPC .... H01L 27/0922 (2013.01); H01L 21/82345 (2013.01); H01L 21/823807 (2013.01); H01L 21/823842 (2013.01); H01L 21/823857 (2013.01); H01L 27/088 (2013.01); H01L 29/4966 (2013.01)

(58) Field of Classification Search
None
See application file for complete search history.

(56) References Cited

U.S. PATENT DOCUMENTS

| 7,504,696 | B2 | 3/2009 | Zhu et al. |
| 8,674,451 | B2 | 3/2014 | Lin et al. |
| 9,024,392 | B2 | 5/2015 | Liaw |
| 9,281,373 | B2 | 3/2016 | Kang |
| 9,502,416 | B1* | 11/2016 | Kim ............... H01L 27/1116 |
| 9,659,937 | B2 | 5/2017 | Chang et al. |
| 9,698,241 | B1 | 7/2017 | Patil et al. |
| 9,754,841 | B2 | 9/2017 | Yang et al. |
| 9,786,759 | B2 | 10/2017 | Park et al. |
| 10,037,995 | B2* | 7/2018 | Liao .............. H01L 21/76897 |

(Continued)

FOREIGN PATENT DOCUMENTS

JP            5390654 B2    1/2014

*Primary Examiner* — Bilkis Jahan
*Assistant Examiner* — Victor V Barzykin
(74) *Attorney, Agent, or Firm* — Lee IP Law, PC

(57) ABSTRACT

A semiconductor device includes first, second, and third transistors on a substrate and having different threshold voltages from each other, each of the first, second, and third transistors including: a gate insulating layer, a first work function metal layer, and a second work function metal layer. The first work function metal layer of the first transistor may include a first sub-work function layer, the first work function metal layer of the second transistor may include a second sub-work function layer, the first work function metal layer of the third transistor may include a third sub-work function layer, and the first, second, and third sub-work function layers may have different work functions from each other.

20 Claims, 13 Drawing Sheets

(56) References Cited

U.S. PATENT DOCUMENTS

| | | | |
|---|---|---|---|
| 2013/0105906 A1 | 5/2013 | Yin et al. | |
| 2015/0214112 A1* | 7/2015 | Zhao | H01L 29/4966 257/369 |
| 2016/0268259 A1* | 9/2016 | Chang | H01L 27/0922 |
| 2016/0351675 A1 | 12/2016 | Patil et al. | |
| 2016/0365347 A1* | 12/2016 | Bao | H01L 27/0924 |
| 2018/0151575 A1* | 5/2018 | Li | H01L 21/823821 |

\* cited by examiner

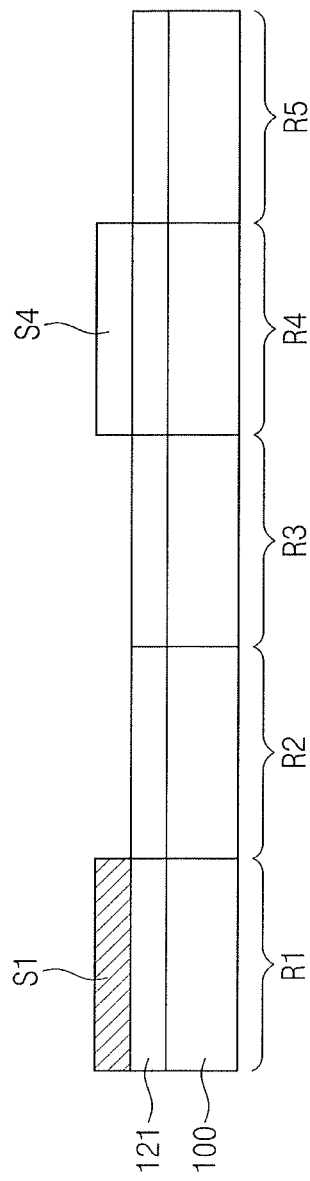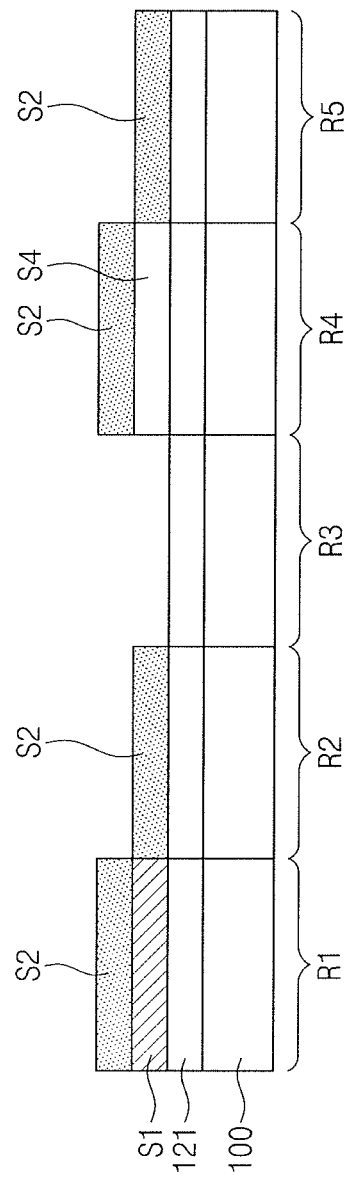

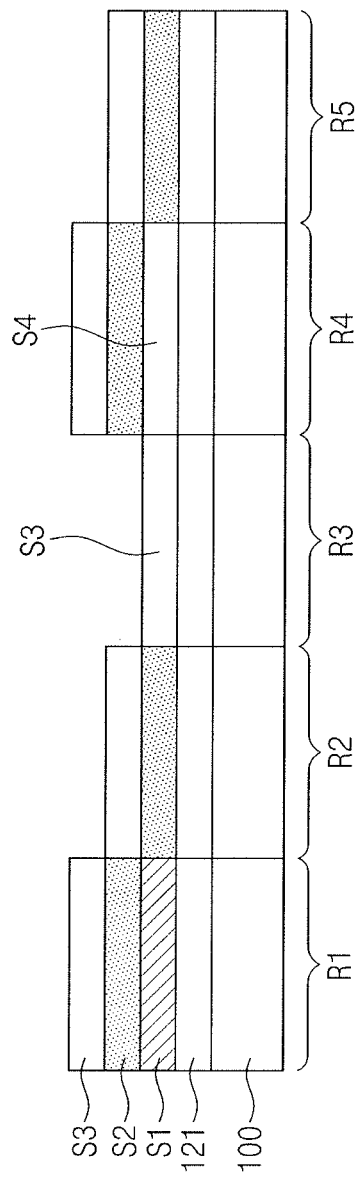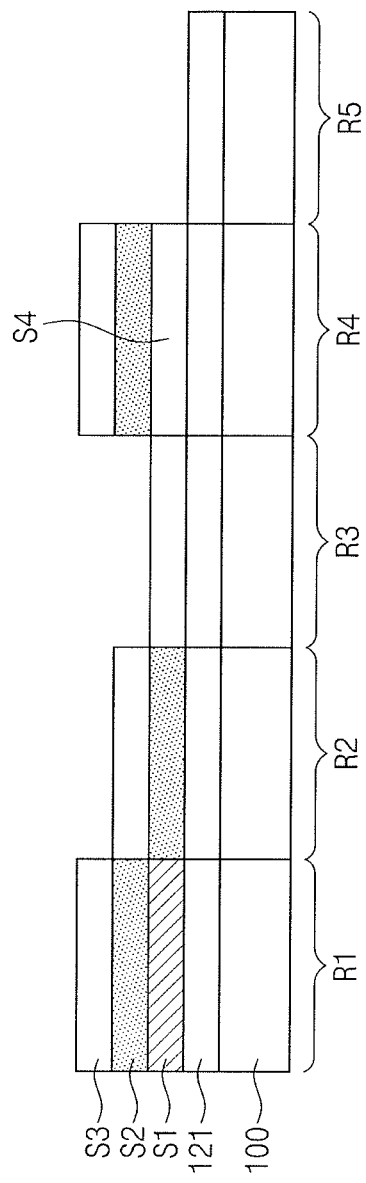

SEMICONDUCTOR DEVICE

CROSS-REFERENCE TO RELATED APPLICATION

Korean Patent Application No. 10-2017-0177895, filed on Dec. 22, 2017, in the Korean Intellectual Property Office, and entitled: "Semiconductor Device," is incorporated by reference herein in its entirety.

BACKGROUND

1. Field

Embodiments relate to a semiconductor device.

2. Description of the Related Art

A semiconductor device may include an integrated circuit including metal-oxide-semiconductor field effect transistors (MOSFETs). To increase integration of a semiconductor device, the MOSFETs may be scaled down, which may impact some operating characteristics.

SUMMARY

Embodiments are directed to a semiconductor device, including first, second, and third transistors on a substrate and having different threshold voltages from each other, each of the first, second, and third transistors including: a gate insulating layer, a first work function metal layer, and a second work function metal layer. The first work function metal layer of the first transistor may include a first sub-work function layer, the first work function metal layer of the second transistor may include a second sub-work function layer, the first work function metal layer of the third transistor may include a third sub-work function layer, and the first, second, and third sub-work function layers may have different work functions from each other.

Embodiments are also directed to a semiconductor device, including first, second, and third transistors on a substrate and having different threshold voltages from each other, each of the first, second, and third transistors including: a gate insulating layer, a first work function metal layer, and a second work function metal layer. The first work function metal layers of the first, second, and third transistors may include first, second, and third sub-work function layers having different work functions, respectively, and thicknesses of the first, second, and third sub-work function layers may be substantially equal to each other.

BRIEF DESCRIPTION OF THE DRAWINGS

Features will become apparent to those of ordinary skill in the art by describing in detail example embodiments with reference to the attached drawings in which:

FIGS. 8 to 12 illustrate cross-sectional views of stages in a method of manufacturing a semiconductor device according to an example embodiment.

DETAILED DESCRIPTION

Figure 1:
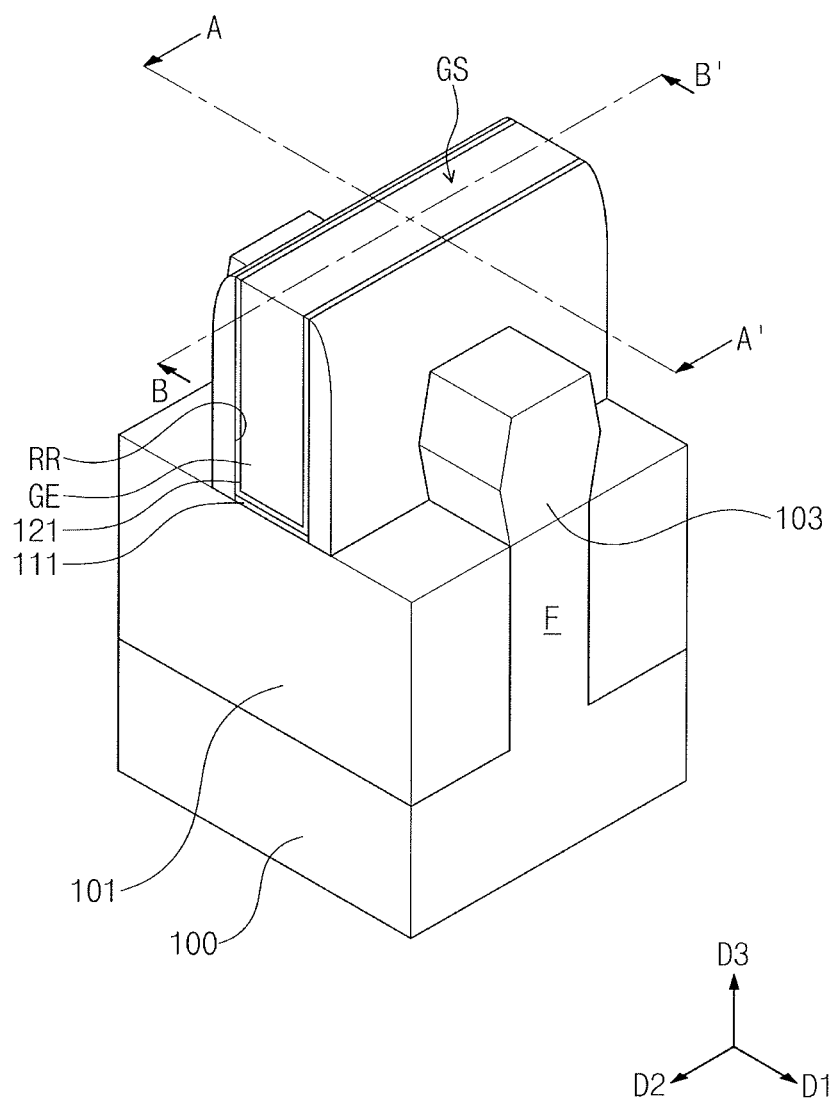
FIG. 1 illustrates a perspective view of a semiconductor device according to an example embodiment.
Figure 2:
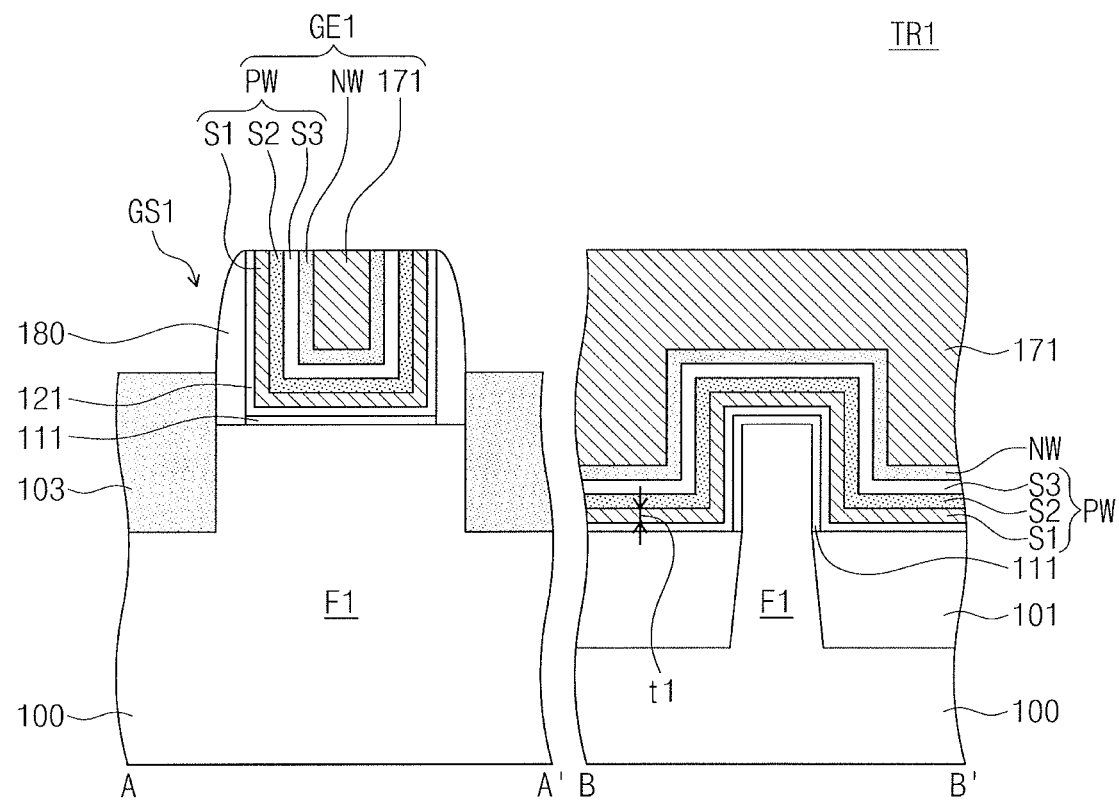
FIGS. 2 to 4 illustrate cross-sectional views of a semiconductor device according to an example embodiment.
Figure 3:
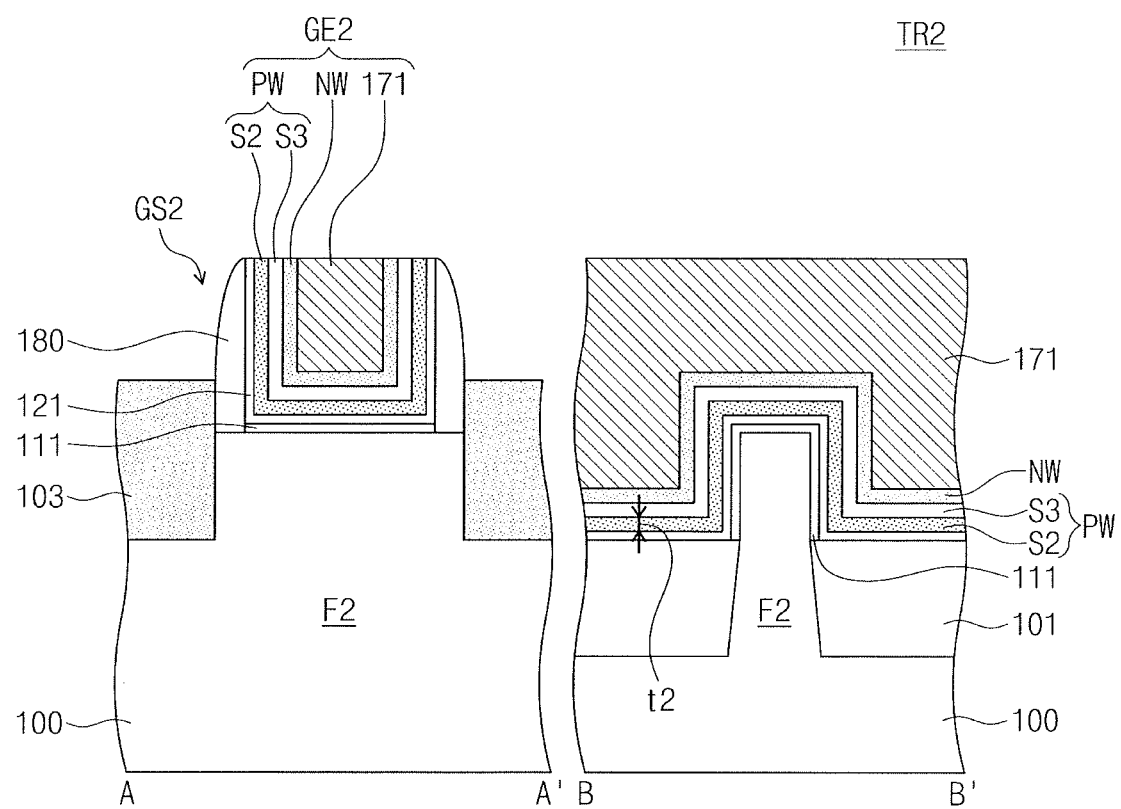
Figure 4:
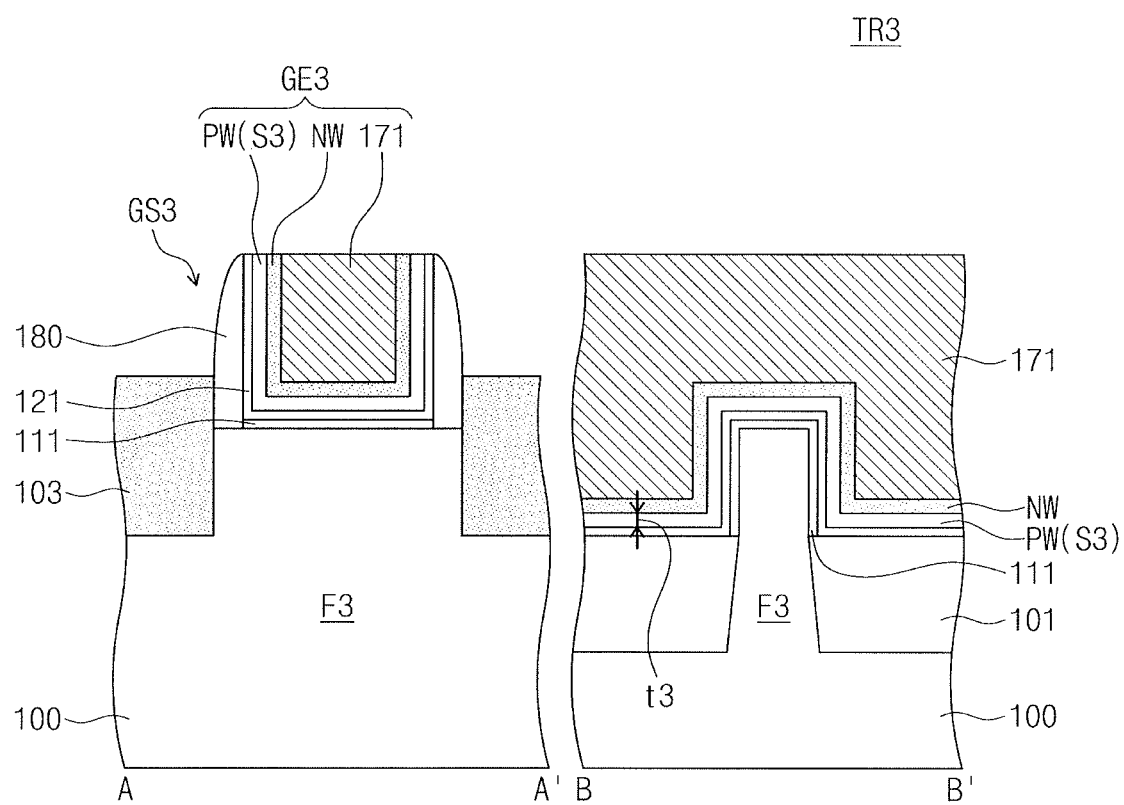

FIG. 1 illustrates a perspective view of a semiconductor device according to an example embodiment. FIGS. 2 to 4 illustrate cross-sectional views of a semiconductor device according to an example embodiment.

Referring to FIGS. 1 to 4, a semiconductor device according to an example embodiment may include first, second and third transistors TR1, TR2, and TR3. FIG. 1 illustrates one transistor. Each of FIGS. 2 to 4 illustrates cross-sectional views corresponding to lines A-A' and B-B' of FIG. 1, such that the first to third transistors TR1, TR2, and TR3 of FIGS. 2 to 4 correspond to the transistor illustrated in FIG. 1.

The first to third transistors TR1, TR2, and TR3 may be provided on a substrate 100. The first to third transistors TR1, TR2, and TR3 may be provided on different regions of the substrate 100. At least some of the first to third transistors TR1, TR2, and TR3 may be adjacent to each other, e.g., directly adjacent with no other transistor interposed therebetween.

The substrate 100 may be a single-crystalline silicon substrate. In another implementation, the substrate 100 may be a silicon-on-insulator (SOI) substrate, a germanium substrate, a germanium-on-insulator (GOI) substrate, a silicon-germanium substrate, or a substrate of an epitaxial thin layer obtained by performing a selective epitaxial growth (SEG) process. In an example embodiment, the substrate 100 may include an N-type or P-type well dopant layer.

The first to third transistors TR1, TR2, and TR3 may be MOS field effect transistors. In an implementation, each of the first to third transistors TR1, TR2, and TR3 may have the same conductivity type. For example, the first to third transistors TR1, TR2, and TR3 may be P-type transistors (e.g., PMOS transistors). The first to third transistors TR1, TR2, and TR3 may have different threshold voltages from each other. The threshold voltage of the third transistor TR3 may be greater than the threshold voltage of the second transistor TR2. The threshold voltage of the second transistor TR2 may be greater than the threshold voltage of the first transistor TR1.

The substrate 100 may include active regions, which may be respectively defined by a device isolation layer 101. The device isolation layer 101 may include silicon oxide. The active regions may include fin patterns F that protrude beyond a top surface of the device isolation layer 101 in a third direction D3. The third direction D3 may be a direction perpendicular to a top surface of the substrate 100. For example, the first, second and third transistors TR1, TR2, and TR3 may include first, second and third fin patterns F1, F2, and F3, respectively. Each of the first to third fin patterns F1, F2, and F3 may extend longitudinally in a first direction D1, which may be parallel to the top surface of the substrate 100.

Each of the first to third transistors TR1, TR2, and TR3 may include a gate structure GS disposed on the substrate 100 and source/drain regions 103 provided at opposite sides of the gate structure GS. The gate structure GS may extend longitudinally in a second direction D2, which may be perpendicular to the first direction D1 and parallel to the top surface of the substrate 100. For example, the first, second and third transistors TR1, TR2, and TR3 may include first, second and third gate structures GS1, GS2, and GS3, respectively.

Each of the first to third gate structures GS1, GS2, and GS3 may include spacers 180 forming opposite sidewalls thereof. For example, the spacers 180 may include silicon oxide. Each of the first to third transistors TR1, TR2, and TR3 (e.g., each of the first to third gate structures GS1, GS2 and GS3) may include a gate insulating layer and a gate electrode GE, which are disposed in a gap region RR defined by the spacers 180. The gate insulating layer may include an interface layer 111 and a high-k dielectric layer 121 on the interface layer 111. The interface layer 111 may be provided between the fin pattern F and the high-k dielectric layer 121. The interface layer 111 may be provided on both sidewalls and a top surface of the fin pattern F protruding from the top surface of the device isolation layer 101. The interface layer 111 may be formed of a low-k dielectric material having a dielectric constant of 9 or less. For example, the interface layer 111 may include a silicon oxide layer or a silicon oxynitride layer. The interface layer 111 may reduce interface defects between the substrate 100 and the high-k dielectric layer 121. The interface layers 111 of the first to third transistors TR1, TR2, and TR3 may be formed of the same material at the same time.

The high-k dielectric layer 121 may be formed of a high-k dielectric material of which a dielectric constant is greater than that of silicon oxide. The high-k dielectric layer 121 may be thicker than the interface layer 111. For example, the high-k dielectric layer 121 may include a metal oxide, a metal silicate, or a metal silicate nitride. The metal oxide may include an oxide containing a metal such as hafnium (Hf), aluminum (Al), lanthanum (La), or zirconium (Zr). For example, the metal oxide may include $HfO_2$, $Al_2O_3$, $La_2O_3$, $ZrO_2$, or a combination thereof. The metal silicate may include a silicate containing a metal such as hafnium (Hf) or zirconium (Zr).

For example, the metal silicate may include hafnium silicate (HfSiO), zirconium silicate (ZrSiO), or a combination thereof. The metal silicate nitride may include a silicate nitride containing a metal such as hafnium (Hf) or zirconium (Zr). For example, the metal silicate nitride may include hafnium silicate nitride (HfSiON), zirconium silicate nitride (ZrSiON), or a combination thereof. In an example embodiment, the high-k dielectric layers 121 of the first to third transistors TR1, TR2, and TR3 may be formed of the same material at the same time. In another implementation, the high-k dielectric layer 121 of at least one of the first to third transistors TR1, TR2, and TR3 may include an element different from that of the high-k dielectric layer 121 of at least another of the first to third transistors TR1, TR2, and TR3. For example, the high-k dielectric layer 121 of the at least one of the first to third transistors TR1, TR2, and TR3 may include a work function adjusting material such as lanthanum (La) or aluminum (Al). The work function adjusting material may form a dipole between the interface layer 111 and the high-k dielectric layer 121 to change an effective work function.

The high-k dielectric layer 121 may be conformally provided in the gap region RR defined by the spacers 180. For example, the high-k dielectric layer 121 may have a U-shape that extends along inner sidewalls of the spacers 180 and a top surface of the interface layer 111. The high-k dielectric layer 121 may extend onto the top surface of the device isolation layer 101.

The source/drain regions 103 may be disposed on each of the first to third fin patterns F1, F2, and F3. In an example embodiment, the source/drain regions 103 may include epitaxial patterns. For example, when the first to third transistors TR1, TR2, and TR3 are P-type transistors (e.g., PMOS transistors), the source/drain regions 103 may be formed of a material providing compressive stress to channel regions of the first to third transistors TR1, TR2, and TR3. For example, the source/drain regions 103 may be formed of silicon-germanium (SiGe).

In another implementation, when the first to third transistors TR1, TR2, and TR3 are N-type transistors (e.g., NMOS transistors), the source/drain regions 103 may be formed of a material providing tensile stress to the channel regions of the first to third transistors TR1, TR2, and TR3. For example, the source/drain regions 103 may be formed of silicon carbide (SiC).

The first, second and third gate structures GS1, GS2 and GS3 may include first, second and third gate electrodes GE1, GE2 and GE3, respectively. Each of the first to third gate electrodes GE1, GE2, and GE3 may include a first work function metal layer PW, a second work function metal layer NW, and an upper conductive layer 171 sequentially provided on the high-k dielectric layer 121. An effective work function of the second work function metal layer NW may be less than an effective work function of the first work function metal layer PW. For example, the effective work function of the first work function metal layer PW may range from about 4.8 eV to about 5.1 eV. The effective work function of the second work function metal layer NW may range from about 4.1 eV to about 4.4 eV.

In an example embodiment, an effective work function of a gate electrode may be a parameter determined (or adjusted) by a kind, a shape and/or a forming process of at least one material of the gate electrode, and may affect a threshold voltage of a MOS field effect transistor including the gate electrode. A work function of a specific material is an energy value needed to remove an electron in the specific material from a Fermi level to a point in the vacuum and means a property of the specific material.

The first work function metal layers PW of the first to third transistors TR1, TR2, and TR3 will be described hereinafter in more detail.

The first work function metal layers PW of the first, second and third transistors TR1. TR2, and TR3 may include first, second and third sub-work function layers S1, S2 and S3 having different effective work functions, respectively. Each of the first to third sub-work function layers S1, S2, and S3 may be in contact with a top surface of a corresponding high-k dielectric layer 121, as follows: the first transistor TR1 may include the first sub-work function layer S1 in contact with the top surface of the high-k dielectric layer 121 thereof; the second transistor TR2 may include the second sub-work function layer S2 in contact with the top surface of the high-k dielectric layer 121 thereof; and the third transistor TR3 may include the third sub-work function layer S3 in contact with the top surface of the high-k dielectric layer 121 thereof.

The effective work function of the first sub-work function layer Si may be less than the effective work function of the second sub-work function layer S2. The effective work function of the second sub-work function layer S2 may be less than the effective work function of the third sub-work function layer S3. For example, the first sub-work function layer SI may include WSi$_x$, TiSiN, TiAlN, WN, TaSiN, TaAlN, TiSi$_x$, TaSi$_x$, Nb, or V, where 'x' is a constant. The second sub-work function layer S2 may include TaN, TiN, Mo, W, or WC. The third sub-work function layer S3 may include Pt, Ru, Ir, Ni, W, WC, WCN, TiN, TiCN, TiBN, Mo, MoN, NbN, or VN.

In an example embodiment, a first thickness t1 of the first sub-work function layer S1, a second thickness t2 of the second sub-work function layer S2, and a third thickness t3 of the third sub-work function layer S3 may be substantially equal to each other. For example, a difference between the first thickness t1, the second thickness t2, and the third thickness t3 may be about 9 Å or less. In an implementation, a top surface of the first sub-work function layer S1, a top surface of the second sub-work function layer S2, and a top surface of the third sub-work function layer S3 may be located at substantially the same height or same level from the substrate 100.

The first work function metal layer PW of the first transistor TR1 may further include the second sub-work function layer S2 disposed between the first sub-work function layer S1 and the second work function metal layer NW. In addition, the first work function metal layer PW of the first transistor TR1 may further include the third sub-work function layer S3 disposed between the second sub-work function layer S2 and the second work function metal layer NW. The first work function metal layer PW of the first transistor TR1 may include the first sub-work function layer S1, the second sub-work function layer S2, and the third sub-work function layer S3 sequentially stacked.

The first work function metal layer PW of the second transistor TR2 may further include the third sub-work function layer S3 disposed between the second sub-work function layer S2 and the second work function metal layer NW. The first work function metal layer PW of the second transistor TR2 may include the second sub-work function layer S2 and the third sub-work function layer S3 sequentially stacked.

Each of the first to third gate electrodes GE1, GE2, and GE3 may include the second work function metal layer NW. According to an example embodiment, each of the first work function metal layers PW of the first to third transistors TR1, TR2, and TR3 may include the third sub-work function layer S3, and the third sub-work function layer S3 may be in contact with the second work function metal layer NW. In another example embodiment, the first work function metal layer PW of the first transistor TR1 may not include the second and third sub-work function layers S2 and S3, and the first sub-work function layer S1 may be in contact with the second work function metal layer NW in the first transistor TR1. Likewise, the first work function metal layer PW of the second transistor TR2 may not include the third sub-work function layer S3, and the second sub-work function layer S2 may be in contact with the second work function metal layer NW in the second transistor TR.

The second work function metal layer NW may include aluminum (Al). For example, the second work function metal layer NW may include TiAl, TiAlC, TaAl, TaAlC, TiAlSi, TiAlSiC, Al, or AlC. In another implementation, the second work function metal layer NW may include TiSi, TiSiC, TaSi, TaSiC, Ti, TiC, Ta, or TaC. In an example embodiment, aluminum in the second work function metal layer NW may be diffused into a layer disposed thereunder. For example, at least a portion of a layer (e.g., the third sub-work function layer S3) being in contact with the second work function metal layer NW may include aluminum diffused from the second work function metal layer NW. On the other hand, a layer (e.g., the first sub-work function layer Si) spaced apart from the second work function metal layer NW may not include aluminum diffused from the second work function metal layer NW. The first work function metal layer PW and the second work function metal layer NW may be provided in U-shapes along an inner surface of the gap region RR illustrated in FIG. 1.

Each of the first to third transistors TR1, TR2, and TR3 (e.g., each of the first to third gate electrodes GE1, GE2 and GE3) may include the upper conductive layer 171 disposed on the second work function metal layer NW. The upper conductive layer 171 may be formed of a material having a resistivity lower than that of the second work function metal layer NW. For example, the upper conductive layer 171 may include tungsten (W). The upper conductive layer 171 may fill a remaining region of the gap region RR illustrated in FIG. 1. In an example embodiment, thicknesses of the upper conductive layers 171 of the first to third transistors TR1, TR2, and TR3 may be different from each other. For example, the upper conductive layer 171 of the third transistor TR3 may be thicker than the upper conductive layer 171 of the second transistor TR2, and the upper conductive layer 171 of the second transistor TR2 may be thicker than the upper conductive layer 171 of the first transistor TR1.

In a fin-type field effect transistor, an ion doping process for adjusting a threshold voltage of the transistor may become complicated as a fin size becomes small. In addition, in a method of adjusting an effective work function by adjusting a thickness of a work function adjusting layer, work function adjustment may be limited by a width and/or a thickness of a gate electrode. In addition, the number of removal processes of the work function adjusting layer for adjusting the thickness may be increased, and difficulty of the removal process may be relatively high. Furthermore, a metal layer may not be removed.

According to an example embodiment, lower portions of the first work function metal layers, which are in contact with the gate insulating layers, may be formed of the first to third sub-work function layers having different work functions from each other, thus simplifying formation of the first to third transistors having different threshold voltages.

Figure 5:
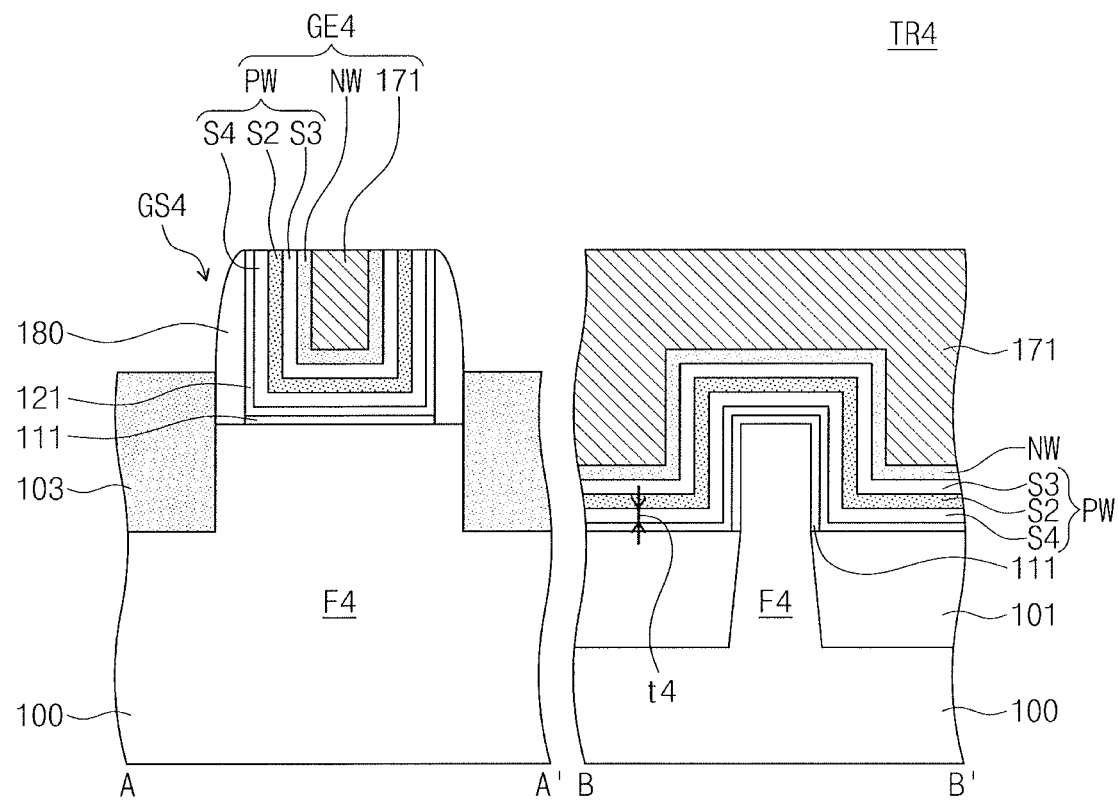
FIG. 5 illustrates a cross-sectional view of a fourth transistor according to an example embodiment.

FIG. 5 is a cross-sectional view illustrating a fourth transistor TR4 according to an example embodiment.

A semiconductor device according to an example embodiment may include the fourth transistor TR4 in addition to the first to third transistors TR1, TR2, and TR3. A threshold voltage of the fourth transistor TR4 may be greater than the threshold voltage of the first transistor TR1 and may be less than the threshold voltage of the second transistor TR2. A fourth gate electrode GE4 of the fourth transistor TR4 may include a first work function metal layer PW and a second work function metal layer NW.

The first work function metal layer PW of the fourth transistor TR4 may include a fourth sub-work function layer S4. An effective work function of the fourth sub-work function layer S4 may be greater than the effective work function of the first sub-work function layer S1 and may be less than the effective work function of the second sub-work function layer S2. For example, the fourth sub-work function layer S4 may include TiSiN, TaN, TiAlN, WSi$_x$, WN, TaSiN, TaAlN, Nb, or V, where 'x' is a constant. A fourth thickness t4 of the fourth sub-work function layer S4 may be substantially equal to the first to third thicknesses t1, t2, and t3. The first work function metal layer PW of the fourth transistor TR4 may further include the second sub-work function layer S2 and the third sub-work function layer S3, which are disposed between the fourth sub-work function layer S4 and the second work function metal layer NW. Other components of the fourth transistor TR4 may be substantially the same as corresponding components of the first transistor TR1.

Figure 6:
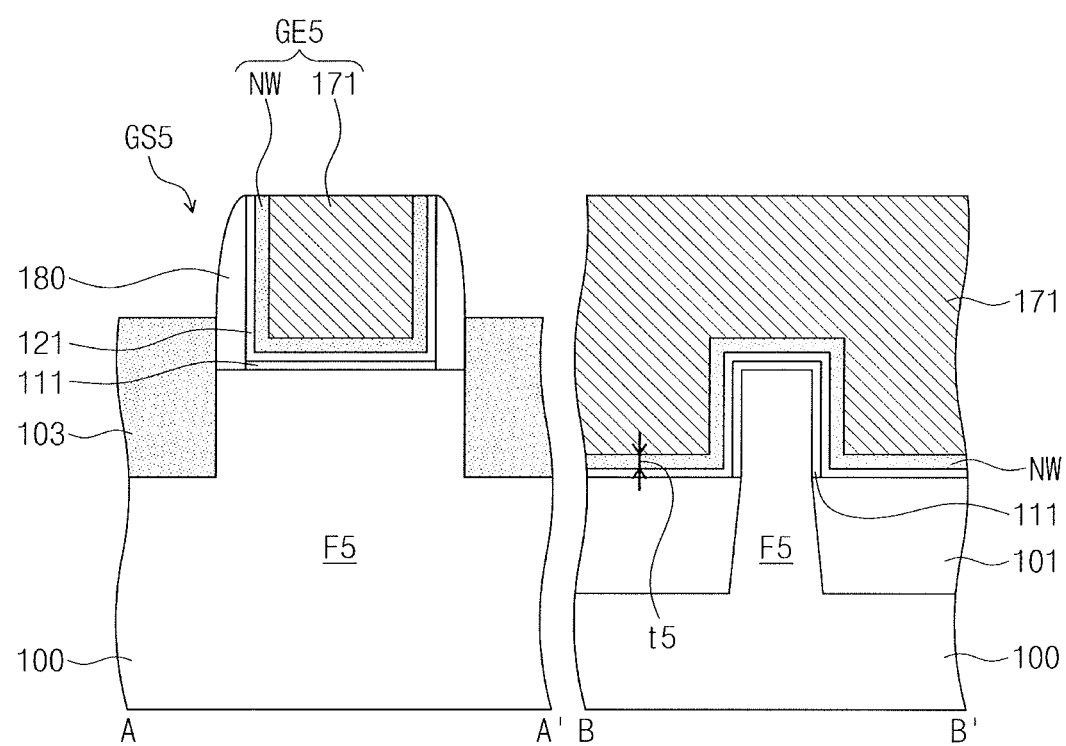
FIG. 6 illustrates a cross-sectional view of a fifth transistor according to an example embodiment.

FIG. 6 illustrates a cross-sectional view of a fifth transistor TR5 according to an example embodiment.

A semiconductor device according to an example embodiment may include the fifth transistor TR5 in addition to the first to fourth transistors TR1, TR2, TR3, and TR4. A threshold voltage of the fifth transistor TR5 may be less than the threshold voltage of the first transistor TR1. A fifth gate electrode GE5 of the fifth transistor TR5 may not include a first work function metal layer PW but may include a second work function metal layer NW that is in contact with the top surface of the high-k dielectric layer 121. The second work function metal layer NW may include the aluminum containing material such as TiAl, TiAlC TaAl, TaAlC, TiAlSi, TiAlSiC, Al, or AlC. A fifth thickness t5 of the second work function metal layer NW may be substantially equal to the first to fourth thicknesses t1, t2, t3, and t4. Other components of the fifth transistor TR5 may be substantially the same as corresponding components of the first transistor TR1.

Figure 7A:
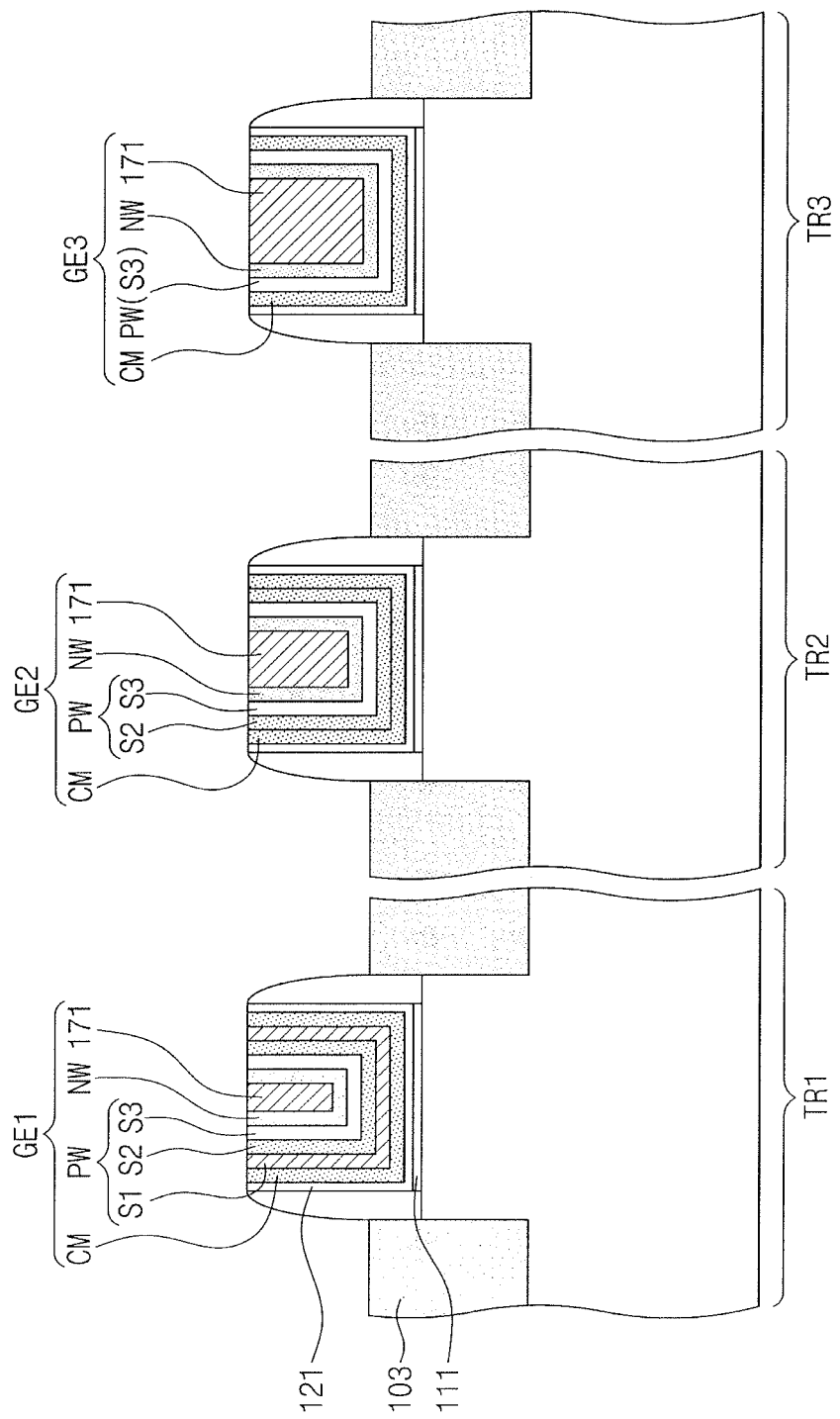
FIGS. 7A and 7B illustrate cross-sectional views of first to fifth transistors according to an example embodiment.
Figure 7B:
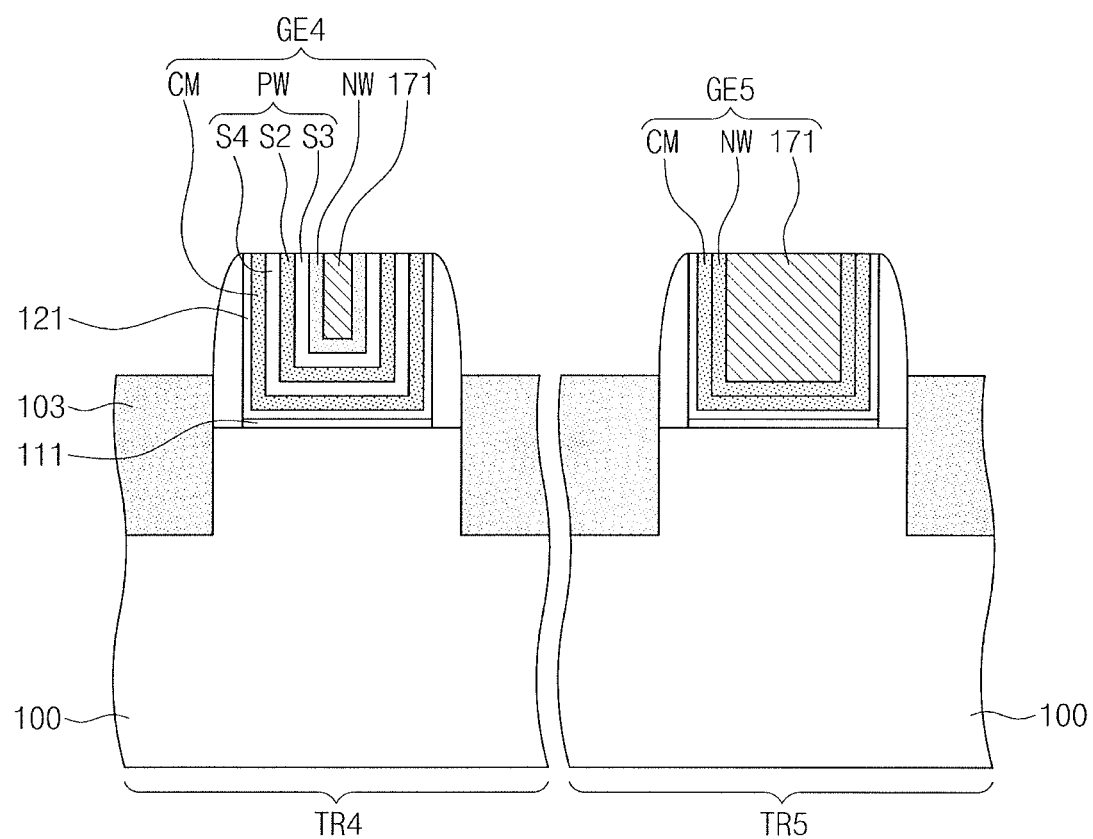

FIGS. 7A and 7B illustrate cross-sectional views of first to fifth transistors according to an example embodiment. Hereinafter, repeated descriptions to the same components as in the above embodiments may be omitted for clarity.

Each of first to fifth transistors TR1 to TR5 according to the present example embodiment may include a capping conductive layer CM that is in contact with the high-k dielectric layer 121. A distance between the high-k dielectric layer 121 and the second work function metal layer NW may be increased by the capping conductive layer CM, as compared with the embodiments of FIGS. 2 to 6. Thicknesses of the capping conductive layers CM of the first to fifth transistors TR1 to TR5 may be substantially equal to each other. The thickness of the capping conductive layer CM may be substantially equal to or less than the first to fifth thicknesses t1 to t5. The capping conductive layer CM may include TiN. The capping conductive layer CM may be conformally formed along a top surface and an inner sidewall of the high-k dielectric layer 121.

In each of the first to fourth transistors TR1 to TR4, the capping conductive layer CM may be provided between the high-k dielectric layer 121 and the first work function metal layer PW. The first to fourth sub-work function layers S1, S2, S3, and S4 may be in contact with top surfaces of the capping conductive layers CM, respectively. In the fifth transistor TR5, the capping conductive layer CM may be provided between the high-k dielectric layer 121 and the second work function metal layer NW. The second work function metal layer NW may be in contact with a top surface of the capping conductive layer CM disposed thereunder.

FIGS. 8 to 12 illustrate cross-sectional views of stages in a method of manufacturing a semiconductor device according to an example embodiment. Except for a substrate 100 and gate structures thereon, repeated descriptions of other components may be omitted for clarity. In an implementation, the first to fifth transistors TR1 to TR5 may be formed together. In another implementation, the first to third transistors TR1 to TR3 may be formed together.

Referring to FIG. 8, the substrate 100 may have first to fifth regions R1 to R5. The first to fifth regions R1 to R5 may be regions on which first to fifth transistors TR1 to TR5 are formed, respectively. A gate insulating layer may be formed on the first to fifth regions R1 to R5. In an example embodiment, the gate insulating layer may include the high-k dielectric layer 121. In an example embodiment, the gate insulating layer may include an interface layer and the high-k dielectric layer 121. For example, the interface layer may include a silicon oxide layer or a silicon oxynitride layer. The interface layer may be formed using a thermal oxidation method or an atomic layer deposition (ALD) method. The interface layer may improve interface characteristics between the substrate 100 and the high-k dielectric layer 121 to improve electron mobility characteristics.

The high-k dielectric layer 121 may be formed of a high-k dielectric material of which a dielectric constant is greater than that of silicon oxide. The high-k dielectric layer 121 may be thicker than the interface layer. The high-k dielectric layer 121 may include a metal oxide, a metal silicate, or a metal silicate nitride. The metal oxide may include an oxide containing a metal such as hafnium (Hf), aluminum (Al), lanthanum (La), or zirconium (Zr). The metal silicate may include a silicate containing a metal such as hafnium (Hf) or zirconium (Zr). The metal silicate nitride may include a silicate nitride containing a metal such as hafnium (Hf) or zirconium (Zr).

The high-k dielectric layer 121 may be formed by, for example, a chemical vapor deposition (CVD) method, a low-pressure CVD (LPCVD) method, a plasma-enhanced CVD (PECVD) method, a metal-organic CVD (MOCVD) method, an ALD method, or a plasma-enhanced ALD (PEALD) method. In an example embodiment, the ALD method or the PEALD method may be used to form a uniform high-k dielectric layer 121.

In an example embodiment, a layer (e.g., an oxide layer) including a work function adjusting material such as aluminum (Al) or lanthanum (La) may be formed on the high-k dielectric layer 121. Thereafter, at least a portion of the work function adjusting material may be diffused into the high-k dielectric layer 121 by a thermal treatment process. In another implementation, the formation of the layer including the work function adjusting material may be omitted.

The first sub-work function layer S1 may be formed on the high-k dielectric layer 121 of the first region R1. The first sub-work function layer S1 may be selectively provided on the first region R1. For example, the first sub-work function layer S1 may be formed on an entire region of the substrate 100, and then the first sub-work function layer S1 on other regions except the first region R1 may be removed. In another implementation, a mask layer that exposes the first region R1 and covers the other regions may be formed before the formation of the first sub-work function layer S1. The first sub-work function layer S1 formed on the other regions except the first region R1 may be removed together with the mask layer. The first sub-work function layer S1 may be formed of $WSi_x$, TiSiN, TiAlN, WN, TaSiN, TaAlN, $TiSi_x$, $TaSi_x$, Nb, or V, where 'x' is a constant.

The fourth sub-work function layer S4 may be formed on the high-k dielectric layer 121 of the fourth region R4. The fourth sub-work function layer S4 may be selectively provided on the fourth region R4. The fourth sub-work function layer S4 may be formed of a layer including TiSiN, TaN, TiAlN, $WSi_x$, WN, TaSiN, TaAlN, Nb, or V, where 'x' is a constant. The fourth sub-work function layer S4 may be formed to have a thickness substantially equal to that of the first sub-work function layer S1.

Referring to FIG. 9, the second sub-work function layer S2 may be formed on the first to fifth regions R1 to R5, and then the second sub-work function layer S2 formed on the third region R3 may be removed. As a result, a top surface of the high-k dielectric layer 121 of the third region R3 may be exposed. The second sub-work function layer S2 may be formed of a layer including TaN, TiN, Mo, W, or WC. The second sub-work function layer S2 may be formed to have a thickness substantially equal to that of the first sub-work function layer S1.

Referring to FIG. 10, the third sub-work function layer S3 may be formed on the first to fifth regions R1 to R5. The third sub-work function layer S3 may be formed to have a thickness substantially equal to that of the first sub-work function layer S1. The third sub-work function layer S3 may be formed of a layer including Pt, Ru, Ir, Ni, W, WC, WCN, TiN, TiCN, TiBN, Mo, MoN, NbN, or VN.

Referring to FIG. 11, the second and third sub-work function layers S2 and S3 on the fifth region R5 may be removed. For example, a mask layer covering the first to fourth regions R1 to R4 may be formed, and then the layers S2 and S3 of the fifth region R5 exposed by the mask layer may be etched. As a result, a top surface of the high-k dielectric layer 121 of the fifth region R5 may be exposed.

Figure 12:
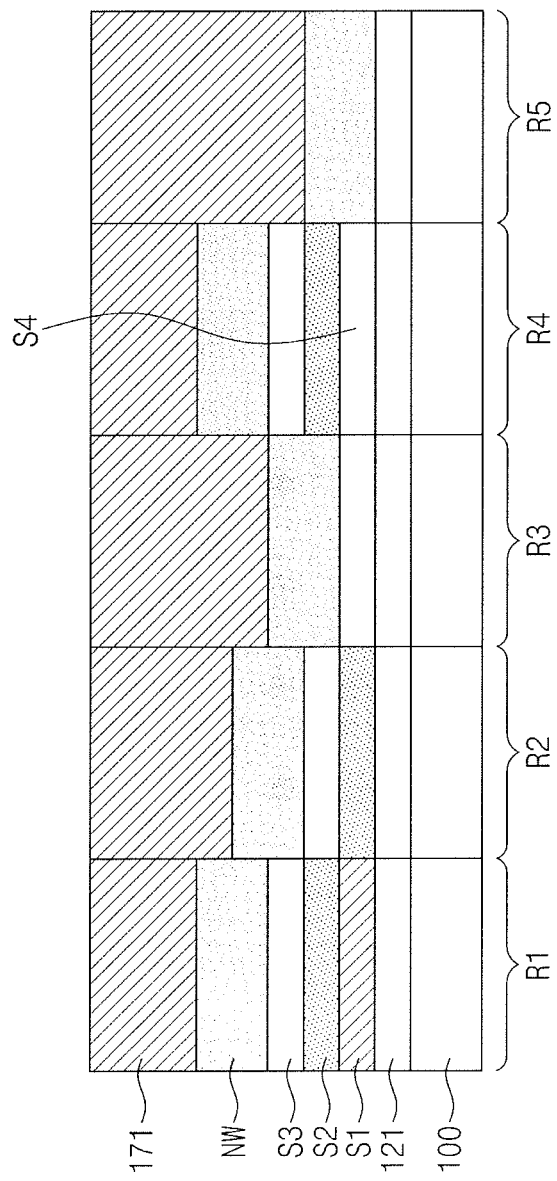

Referring to FIG. 12, the second work function metal layer NW and an upper conductive layer 171 may be sequentially formed on the first to fifth regions R1 to R5. The second work function metal layer NW may include TiAl, TiAlC, TaAl, TaAlC, TiAlSi, TiAlSiC, Al, or AlC. In another implementation, the second work function metal layer NW may include TiSi, TiSiC, TaSi, TaSiC, Ti, TiC, Ta, or TaC. For example, the upper conductive layer 171 may be formed of tungsten (W). Bottom surfaces of the upper conductive layer 171, which are disposed on the first to fifth regions R1 to R5, respectively, may be disposed at different levels from each other. In another implementation, top surfaces of the upper conductive layer 171, which are disposed on the first to fifth regions R1 to R5, respectively, may be disposed at substantially the same level.

Figure 13:
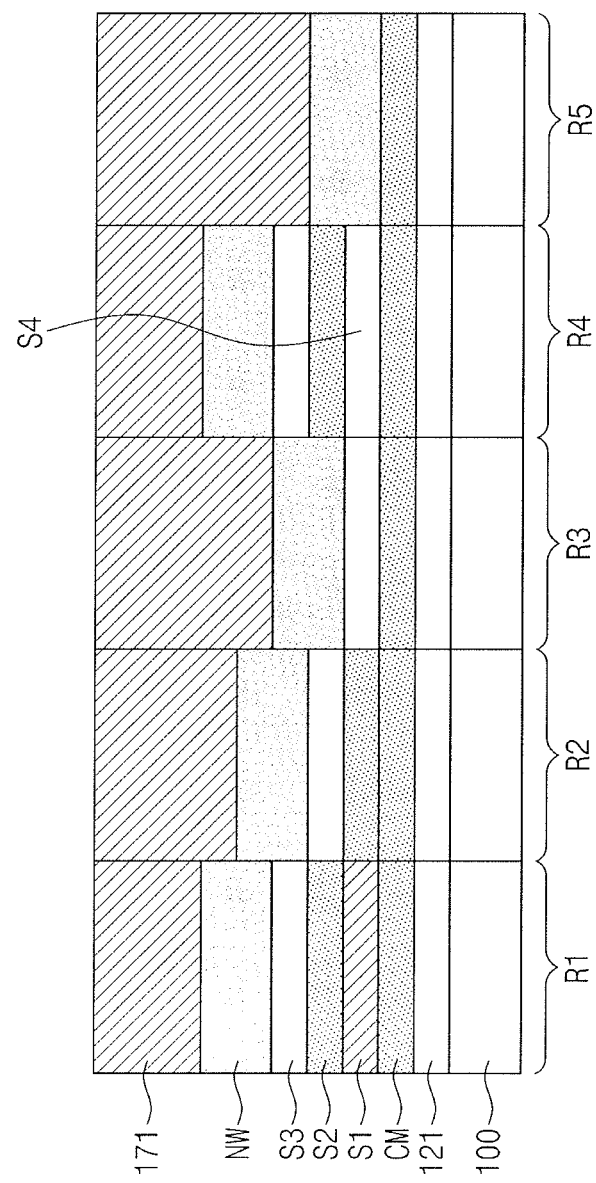
FIG. 13 illustrates a cross-sectional view of a stage in a method of manufacturing a semiconductor device according to an example embodiment.

FIG. 13 illustrates a cross-sectional view of a stage in a method of manufacturing a semiconductor device according to an example embodiment. The present example embodiment illustrates a method of manufacturing the semiconductor device illustrated in FIGS. 7A and 7B.

Referring to FIG. 13, the capping conductive layer CM may be formed on the high-k dielectric layer 121 before the formation of the first sub-work function layer S1 and the fourth sub-work function layer S4 described with reference to FIG. 8. FIG. 13 illustrates the capping conductive layer CM formed on all of the first to fifth regions R1 to R5. In another implementation, the capping conductive layer CM may be omitted from at least one of the first to fifth regions R1 to R5. The capping conductive layer CM may be formed of a TiN layer. Subsequent processes may be substantially the same as described with reference to FIGS. 8 to 12.

Figure 14A:
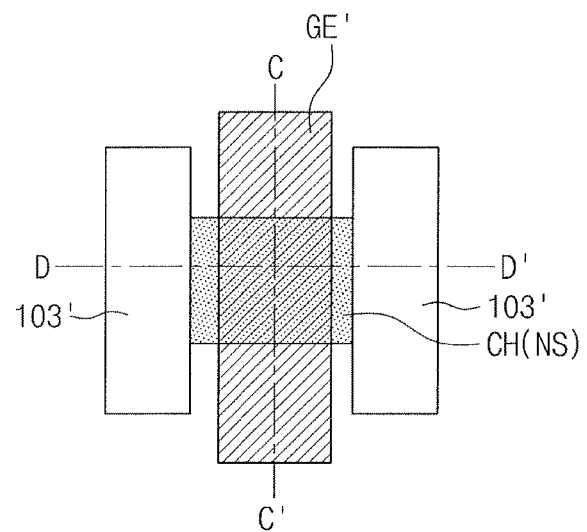
FIG. 14A illustrates a plan view of a transistor according to an example embodiment.
Figure 14B:
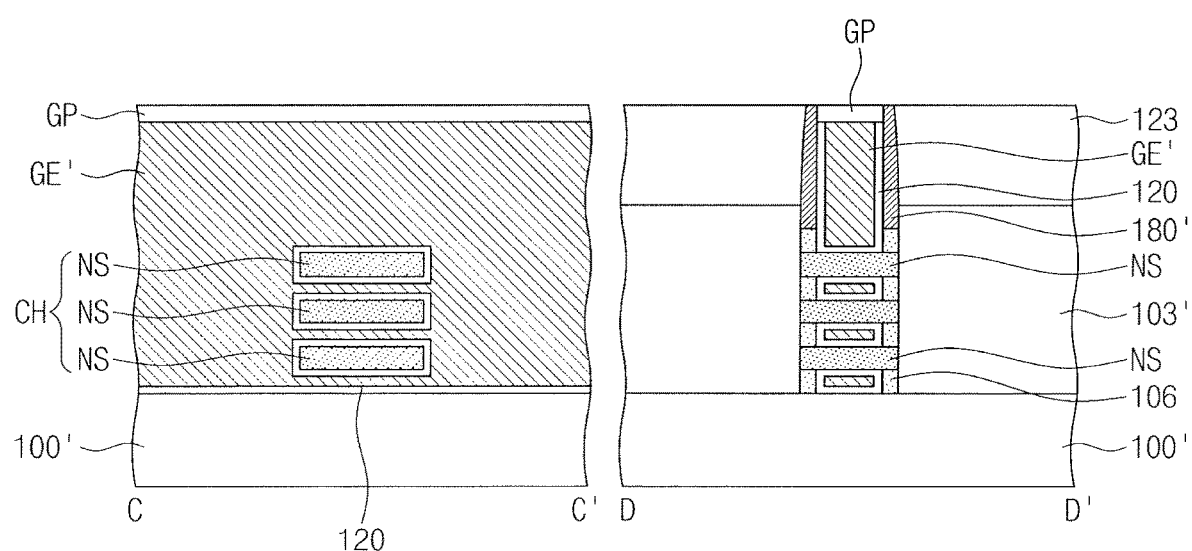
FIG. 14B illustrates cross-sectional views taken along lines C-C' and D-D' of FIG. 14A.

FIG. 14A illustrates a plan view of a transistor according to an example embodiment. FIG. 14B illustrates cross-sectional views taken along lines C-C' and D-D' of FIG. 14A.

Transistors according to the present example embodiment may be gate-all-around-type transistors. For example, the transistor according to the present embodiment may include a channel region CH that includes a plurality of channel portions NS spaced apart from a substrate 100'. A gate insulating layer 120 and a gate electrode GE' may surround outer circumferential surfaces of the channel portions NS between spacers 180'. Source/drain regions 103 may be provided with the channel region CH interposed therebetween. Barrier insulating patterns 106 may be provided between the gate insulating layer 120 and source/drain regions 103'. For example, the barrier insulating patterns 106 may include silicon oxide. A capping pattern GP may be provided on the gate electrode GE'. For example, the capping pattern GP may be formed of at least one of silicon oxide, silicon nitride, or silicon oxynitride. An interlayer insulating layer 123 may be provided to cover the source/drain regions 103.

The fin-type transistors described with reference to FIGS. 1 to 6, the first to fifth transistors TR1 to TR5, may be replaced with the gate-all-around-type transistors according to the present example embodiment. Components and a forming method of the gate electrode GE' may correspond to the components and the forming method of the gate electrode described with reference to FIGS. 1 to 13.

As described above, embodiments relate to a semiconductor device including field effect transistors having different threshold voltages from each other and a method of manufacturing the same. According to some example embodiments, a plurality of transistors having improved electrical characteristics and different threshold voltages may be provided. Embodiments may provide a semiconductor device with improved electrical characteristics. Embodiments may also provide a method of manufacturing a semiconductor device, in which a plurality of transistors having different threshold voltages from each other may be manufactured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   first, second, and third transistors on a substrate and having different threshold voltages from each other, each of the first, second, and third transistors including:
   a gate insulating layer, a first work function metal layer, and a second work function metal layer, wherein:
   the first work function metal layer of the first transistor includes a first sub-work function layer,
   the first work function metal layer of the second transistor includes a second sub-work function layer,
   the first work function metal layer of the third transistor includes a third sub-work function layer, and
   the first, second, and third sub-work function layers have different materials and different work functions from each other.

2. The semiconductor device as claimed in claim 1, wherein the first, second, and third sub-work function layers are in contact with top surfaces of the gate insulating layers of the first, second, and third transistors, respectively.

3. The semiconductor device as claimed in claim 1, wherein a difference in thicknesses of the first, second, and third sub-work function layers is 9 Å or less.

4. The semiconductor device as claimed in claim 1, wherein an effective work function of the second work function metal layer is less than an effective work function of the first work function metal layer.

5. The semiconductor device as claimed in claim 4, wherein the second work function metal layer includes aluminum.

6. The semiconductor device as claimed in claim 1, wherein:
an effective work function of the second sub-work function layer is greater than an effective work function of the first sub-work function layer, and
an effective work function of the third sub-work function layer is greater than the effective work function of the second sub-work function layer.

7. The semiconductor device as claimed in claim 1, wherein the first work function metal layer of the first transistor includes another second sub-work function layer, the other second sub-work function layer being between the first sub-work function layer and the second work function metal layer.

8. The semiconductor device as claimed in claim 7, wherein the first work function metal layer of the first transistor includes another third sub-work function layer, the other third sub-work function layer being between the other second sub-work function layer of the first transistor and the second work function metal layer.

9. The semiconductor device as claimed in claim 7, wherein the first work function metal layer of the second transistor includes another third sub-work function layer, the other third sub-work function layer being between the second sub-work function layer of the second transistor and the second work function metal layer.

10. A semiconductor device, comprising:
first, second, and third transistors on a substrate and having different threshold voltages from each other, each of the first, second, and third transistors including:
a gate insulating layer, a first work function metal layer, and a second work function metal layer, wherein:
the first work function metal layer of the first transistor includes a first sub-work function layer,
the first work function metal layer of the second transistor includes a second sub-work function layer,
the first work function metal layer of the third transistor includes a third sub-work function layer,
the first sub-work function layer includes $WSi_x$, TiSiN, TiAlN, WN, TaSiN, TaAlN, $TiSi_x$, $TaSi_x$, Nb, or V, where 'x' is a constant,
the second sub-work function layer includes TaN, TiN, Mo, W, or WC, provided that the second sub-work function layer does not include a same material included in the first sub-work function layer, and
the third sub-work function layer includes Pt, Ru, Ir, Ni, W, WC, WCN, TiN, TiCN, TiBN, Mo, MoN, NbN, or VN, provided that the third sub-work function layer does not include a same material included in the first sub-work function layer and does not include a same material included in the second sub-work function layer.

11. The semiconductor device as claimed in claim 1, wherein each of the first, second, and third transistors further includes an upper conductive layer on the second work function metal layer.

12. The semiconductor device as claimed in claim 1, further comprising a fourth transistor on the substrate and including the gate insulating layer, the first work function metal layer, and the second work function metal layer, wherein:
the first work function metal layer of the fourth transistor includes a fourth sub-work function layer, and
an effective work function of the fourth sub-work function layer is greater than an effective work function of the first sub-work function layer and is less than an effective work function of the second sub-work function layer.

13. The semiconductor device as claimed in claim 12, wherein the first work function metal layer of the fourth transistor includes another second sub-work function layer and another third sub-work function layer, the other second sub-work function layer and the other third sub-work function layers being sequentially stacked on the fourth sub-work function layer.

14. The semiconductor device as claimed in claim 12, wherein the fourth sub-work function layer includes TiSiN, TaN, TiAlN, $WSi_x$, WN, TaSiN, TaAlN, Nb, or V, where 'x' is a constant.

15. The semiconductor device as claimed in claim 11, further comprising a fifth transistor on the substrate and including the gate insulating layer and the second work function metal layer,
wherein the second work function metal layer of the fifth transistor is in contact with the gate insulating layer of the fifth transistor.

16. The semiconductor device as claimed in claim 1, wherein:
each of the first, second, and third transistors further includes a capping conductive layer between the gate insulating layer and the first work function metal layer, and
the first, second, and third sub-work function layers are in contact with top surfaces of the capping conductive layers of the first, second, and third transistors, respectively.

17. A semiconductor device, comprising:
first, second, and third transistors on a substrate and having different threshold voltages from each other, each of the first, second, and third transistors including:
a gate insulating layer, a first work function metal layer, and a second work function metal layer, wherein:
the first work function metal layers of the first, second, and third transistors include first, second, and third sub-work function layers having different materials and different work functions, respectively, and
a difference in thicknesses of the first, second, and third sub-work function layers is 9 Å or less.

18. The semiconductor device as claimed in claim 17, wherein the work function of the second sub-work function layer is greater than the work function of the first sub-work function layer, and the work function of the third sub-work function layer is greater than the work function of the second sub-work function layer.

19. The semiconductor device as claimed in claim 17, wherein the second work function metal layer includes TiAl, TiAlC, TaAl, TaAlC, TiAlSi, TiAlSiC, Al, AlC, TiSi, TiSiC, TaSi, TaSiC, Ti, TiC, Ta, or TaC.

20. The semiconductor device as claimed in claim 17, wherein the first, second, and third sub-work function layers are in contact with top surfaces of the gate insulating layers of the first, second, and third transistors, respectively.

* * * * *